United States Patent
Kukanskis et al.

(10) Patent No.: US 6,767,445 B2
(45) Date of Patent: Jul. 27, 2004

(54) METHOD FOR THE MANUFACTURE OF PRINTED CIRCUIT BOARDS WITH INTEGRAL PLATED RESISTORS

(76) Inventors: Peter Kukanskis, 245 Quassapaug Rd., Woodbury, CT (US) 06798; Frank Durso, 386 Towpath La., Cheshire, CT (US) 06410; David Sawoska, 22 Kent Ter., Watertown, CT (US) 06795

( * ) Notice: Subject to any disclaimer, the term of this patent is extended or adjusted under 35 U.S.C. 154(b) by 104 days.

(21) Appl. No.: 10/271,817

(22) Filed: Oct. 16, 2002

(65) Prior Publication Data

US 2004/0076743 A1 Apr. 22, 2004

(51) Int. Cl.$^7$ .............................. H05K 1/00; H05K 1/16
(52) U.S. Cl. ....................... 205/125; 205/126; 205/196; 205/205; 205/208; 205/220; 427/98; 427/259; 427/282; 427/304; 427/305; 427/404; 427/443.1; 438/382
(58) Field of Search ............................... 205/125, 126, 205/196, 205, 208, 210, 220, 920; 427/98, 259, 282, 304, 305, 404, 439, 443.1; 438/382

(56) References Cited

U.S. PATENT DOCUMENTS

| | | | |
|---|---|---|---|
| 6,281,090 B1 | | 8/2001 | Kukanskis et al. |
| 6,284,982 B1 | * | 9/2001 | Kusner et al. ............... 174/255 |
| 6,521,285 B1 | * | 2/2003 | Biebuyck et al. .............. 427/98 |
| 6,524,663 B1 | * | 2/2003 | Kelly et al. .................. 427/553 |
| 6,585,904 B2 | * | 7/2003 | Kukanskis et al. ........... 216/13 |
| 6,606,792 B1 | * | 8/2003 | Andresakis .................. 29/846 |

FOREIGN PATENT DOCUMENTS

JP       10-190183       *   7/1998

* cited by examiner

*Primary Examiner*—Roy King
*Assistant Examiner*—William T. Leader
(74) *Attorney, Agent, or Firm*—Carmody & Torrance LLP

(57) ABSTRACT

The present invention is a process for manufacturing resistors integral with the printed circuit board by plating the resistors onto the insulative substrate. The invention uses a mask during the activation step so as to selectively activate only selected portions of the surface thus enabling smaller areas to be plated on the printed circuit board because no plating mask is used. The process of the instant invention produced printed circuit boards having greater uniformity and reliability as compared to the prior art.

26 Claims, No Drawings

METHOD FOR THE MANUFACTURE OF PRINTED CIRCUIT BOARDS WITH INTEGRAL PLATED RESISTORS

FIELD OF INVENTION

The present invention relates to a process for the manufacture of double-sided or multi-layer printed circuit boards with integral plated resistors. The proposed method selectively activates exposed areas of a metal clad laminate to accept plating thereon in a process for manufacturing printed circuit boards. The method of the instant invention does not use a plating mask so that much smaller areas may be plated onto the printed circuit board. Other advantages are also realized by the process of the instant invention as compared to the prior art.

BACKGROUND OF THE INVENTION

In the manufacture of printed circuits, it is commonplace to provide planar boards having circuitry on each side thereof. It is also commonplace to produce boards comprised of integral planar laminates of insulating substrate and conductive metal, wherein one or more parallel innerlayers or planes of the conductive metal, separated by insulating substrate, are present within the structure with the exposed outer surfaces, along with the inner planes, of the laminate containing printed circuit patterns.

The typical manufacturing sequence for producing printed circuit boards begins with a copper-clad laminate. The copper-clad laminate comprises a glass reinforced epoxy insulating substrate with copper foil adhered to both planar surfaces of the substrate, although other types of insulating substrates such as paper phenolic and polyimide have also been used. In the case of multi-layer boards, the starting material is a copper clad laminate, which comprises inner planes of circuitry called innerlayers.

Simple printed circuit boards and innerlayers of a multi-layer circuit board are generally produced through a technique called print and etch. In this manner, a photopolymer is laminated or coated on the copper surface of a copper clad laminate. The photopolymer is then selectively imaged using negative or positive photomask technology and developed to produce the desired circuit pattern on the surfaces of the copper clad laminate. The exposed copper is then etched away and the photopolymer stripped, revealing the desired circuit pattern.

Embedded passive technology (EPT) is a relatively new technology that has been used to fabricate passives, such as resistors and capacitors, into printed circuit boards during the board fabrication process. Compared with integrated passives, in which passive arrays and networks are arranged on carrier substrates, embedded passives are fabricated into the substrate during processing. EPT is driven by various factors, including the need for better electrical performance, higher packaging density of passives, and potential cost savings. Using EPT, passives may be placed directly below the active device, thus resulting in a shorter distance between the passive and active components and reducing the parasitic effect associated with surface mounted passives, resulting in better signal transmission and less cross talk.

One example of an EPT process is described in U.S. Pat. No. 6,281,090 to Kukanskis et al., the subject matter of which is incorporated herein by reference in its entirety. This process involves the following sequence of processing steps: 1) applying an etch resist on the surface of a metal clad laminate (or multilayer package) in a desired pattern, wherein the pattern preferably defines the conductive circuits desired in a positive manner and defines the areas between the circuits and locations for the resistors in a negative manner; 2) etching away the exposed copper and preferably removing the etch resist; 3) activating the surfaces to accept plating thereon; 4) applying a plating mask which covers substantially all of the surfaces except for the areas where the resistors are to be plated; 5) plating the exposed areas with a resistive material; 6) stripping away the plating mask; and 7) coating the surface of the board with a protective coating.

In contrast, the process of the instant invention does not use a mask during the plating step but instead selectively activates the surface of the metal-clad laminate so as to prevent the entire surface of the substrate from being activated. The selective activation step is generally accomplished using a mask to prevent the entire substrate from being activated. The remaining steps in the process are similar to the process described in the U.S. Pat. No. 6,281,090.

The method of the instant invention provides several key advantages over methods of the prior art.

One notable advantage of the process of the instant invention is that there is no galvanic plating effect caused by the copper cladding. Galvanic effects change the plating potential at the resistor site so that the deposition of the resistive metal will either become less efficient, thereby causing skip plating, or will plate at a greatly reduced thickness, thereby yielding much higher resistor values or a porous plate that will fail under testing. The process of the instant invention solves the problem of galvanic effects by opening up non-essential areas on the copper circuit by removing the plating mask, and causing these areas to plate, thus changing the potential at the resistor site so that uniform plating can be realized. By plating all of the resistors by the novel process of the instant invention, the inventors have discovered that galvanic effects appear to be eliminated.

A second advantage in the process of the instant invention is the ability to plate smaller areas on the printed circuit board because no plating mask is used. The plating mask will create a higher aspect ratio on the three dimensional surface created by the etched copper circuitry, thereby preventing solution access and/or movement into small plating areas. It is generally necessary to use a plating mask to prevent the whole board from plating, which will occur on any activated surface. The process of the instant invention advantageously does not use a plating mask but uses a mask only for selectively activating the surface prior to plating.

The process of the instant invention also realizes greater uniformity and consistency. The inventors have surprisingly observed greater uniformity of resistance for different size resistors.

Finally, the resistive metal used in the process of the instant invention may obviate the need for oxidation of the copper circuitry. Normally, copper circuits used to make a multi-layer core have to be coated with an oxide to reduce the interaction of the copper with the substrate and thereby minimize the likelihood that the multi-layer board will delaminate during the assembly operation. The plating solution of the instant invention provides a barrier layer that does not need further processing to avoid delamination in subsequent processing steps.

SUMMARY OF THE INVENTION

The current invention discloses a process for printing and plating resistors as an integral part of a printed circuit board.

The foregoing process is described in its basic form by the following sequence of processing steps:

(a) printing and etching an electronic circuit in a desired pattern on a surface of a metal clad laminate (or multilayer package). The desired pattern should preferably define the conductive circuits desired in a positive manner and should define the areas between the circuits and the locations for the resistors in a negative manner. The laminate will then generally comprise a polymer-based core with metal cladding thereupon in the form of the desired circuit pattern, and openings in said desired pattern of said electronic circuit onto which a resistive material can be plated;

(b) coating said printed and etched electronic circuit (laminate) with a resist so that the openings in the desired pattern and a portion of the metal cladding are exposed;

(c) conditioning and selectively activating the exposed areas of the laminate to accept plating thereon;

(d) stripping the resist; and (e) plating the activated area with said resistive material to create an integral plated resistor.

In an alternative and preferred embodiment, the printed and etched electronic circuit may be conditioned prior to being coated with a photoresist, instead of during the activation step.

In a preferred embodiment, the substrate may be subjected to a dielectric etchant after step (b) but before step (c) in order to uniformize the dielectric surface. The inventors have found that with most materials, etching at this point to uniformize the dielectric surface will provide plated resistors with more constant and predictable resistance.

In another preferred embodiment, after step (e), the plated resistors are coated with a dielectric material to protect the board from damage in subsequent processing steps and enhance the durability of the resulting product.

DETAILED DESCRIPTION OF THE INVENTION

The processes described herein provide a method of forming a resistor between two conductive areas, which areas are upon and separated by an insulating substrate. The method described provides for plating a resistive material onto the insulating substrate, which is between the conductive areas, such that the resistive material connects the conductive areas. The processes described are particularly useful in producing printed circuit boards with plated resistors, which are integral with the circuits. The processes described herein also provide a method for subsequent lamination of the printed circuit boards to produce multi-layer boards.

An example of a processing sequence for the practice of the invention is described as follows:

(a) apply an etch resist onto the surfaces of a metal clad laminate such that the resist defines the desired circuitry in a positive manner and the areas between the circuits, including the locations for the resistors, are defined in a negative manner;

(b) etch away exposed copper surfaces and strip the resist;

(c) optionally, treat the exposed dielectric surfaces with a process selected from the group consisting of chemical etching, plasma etching, laser normalization, vapor blasting, sanding, shot blasting, and sand blasting;

(d) activate the exposed dielectric surfaces through a mask to selectively activate only portions of the exposed dielectric surfaces;

(e) strip the resist;

(f) plate the activated surfaces with a resistive material;

(g) optionally, contact the plated areas with an oxidant;

(h) optionally, coat the resistors with a permanent protective coating.

Steps (a) and (b) together call for the creation of defined circuitry on the surfaces of a metal clad dielectric laminate (or multi-layer package—several layers of circuitry containing one or more innerlayers of circuitry, which have been laminated into a single planar package. The innerlayers may or may not contain the plated resistors of this invention. If so, then the innerlayers may be fabricated by the process described herein). The metal clad laminate may optionally have through holes in it in a desired array. The through holes may or may not be plated at this point. The key in steps (a) and (b) is the definition and creation of a circuit pattern on the surfaces of the metal clad laminate along with the definition and creation of specific breaks in the circuitry where the resistors will be plated (the "resistor areas"). The length and width of the specific resistor areas will obviously directly impact the resistance achieved after plating.

The definition and creation of circuitry and the resistor areas can be accomplished in many ways. The most prevalent way is through the subtractive process as described in current steps (a) and (b). In the subtractive process, a metal (usually copper) clad laminate is used. The metal clad laminate comprises a planar dielectric substrate with metal foil adhered to both exterior surfaces. As discussed, the dielectric substrate is typically glass reinforced epoxy, but can also be a variety of other insulative materials known in the art. In any case, a resist pattern is applied to the metal surfaces such that the resist defines the circuits in a positive manner and the areas between the circuits and the resistor areas in a negative manner. The most typical way of accomplishing this is to use a photoresist. In this case the photoresist is applied to the metal surfaces in either liquid or dry form. The photoresist is then selectively exposed to actinic radiation through a photomask. Depending on the photomask technology used, the unexposed or exposed areas of the resist are developed away revealing the desired pattern. As an alternative, the resist may be screened onto the metal surfaces directly in the desired pattern. After the circuits are defined with the resist, the exposed copper areas are etched away and the resist is stripped revealing the circuits. Thus the areas between the circuits and the resistor areas are now bare dielectric.

Step (c) is optional, but recommended. In order for the resistors to be usable and reliable the resistance must be predictable, relatively constant and reliable. The inventors have found that in order to achieve plated resistors with predictable, relatively constant and reliable resistance, the dielectric surface to be plated with the resistor must be uniform. In this regard the inventors have achieved dielectric surface uniformity and predictable, relatively constant and reliable resistance of the plated resistors by uniformizing the dielectric surface upon which the resistor is to be plated. Uniformizing can be achieved in several ways such as vapor blasting, chemical etching, plasma etching, laser normalization or mechanical uniformization. Mechanical uniformization can be achieved by sanding, sand blasting or shot blasting. The inventors have found that surface uniformization through chemical etching to be the most reliable and efficient means. The particular etchant used in this regard must be matched with the dielectric being used. However, if glass reinforced epoxy is used, the inventors have found that alkaline permanganate, concentrated sulfuric acid, chromic acid or plasma to be particularly useful in etching and uniformizing the surface of the dielectric. Solutions of sodium or potassium permanganate at concentrations in excess of 50 grams/liter, in 10% by weight caustic solution, at temperatures in excess of 140° F. and for times of 2 to 20 minutes are preferred in this regard. If permanganates are used in this regard they may be preceded with a swellant or sensitizer, which makes the dielectric more susceptible to the permanganate etch. A typical swellant for epoxy is m-pyrol applied full strength at from 90–120° F. for from 1 to 5 minutes. In addition the permanganate etch is typically followed by an acid reducing solution, which will remove the permanganate residues.

Step (d) involved selectively activating the surfaces to be plated. A mask is used so that the surface is selectively activated only on the surfaces not covered by the mask. Activation of the surfaces can range in complexity from a single dip in a precious metal activator (or non-precious metal or other activators know in the art) to a full plating cycle involving numerous steps. Typically the activation process will begin with a conditioner (surfactant or other type), followed by an activator ($PdCl_2$/$SnCl_2$ Colloid) and an accelerator. Clean water rinses are interposed between each chemical treatment. Regardless of the activation cycle chosen, its primary purpose is to treat the surfaces such that they initiate and accept plating. A wide variety of methods for achieving conditioning and activation are known in the art, any of which may be advantageously utilized here. U.S. Pat. No. 5,032,427 (Kukanskis, et al.), U.S. Pat. No. 4,976,990 (Bach et al.) and U.S. Pat. No. 4,863,758 (Rhodenizer), the teachings of which are incorporated herein by reference in their entirety, disclose suitable conditioning and activation methods useful in the process of the instant invention.

In an alternative embodiment, the inventors have found that it may be advantageous to condition the surface prior to applying the photoresist in steps (a) and (b) instead of during the activation step. Conditioning generally involves treatment of the surfaces with aqueous solutions of organic substances such as surfactants or organosilanes in order to enhance subsequent activation and plating. Conditioning is further described in the patents referenced above.

Step (e) involves a simple stripping of the resist. Depending upon the resist used, the stripping can occur in aqueous alkaline solutions or in solutions of organic solvents. The use of aqueous strippable resists is preferred. In addition, one should be sure that the resist stripping operation does not negatively affect the conditioning and activation of the surfaces or the subsequent plating.

Step (f) involves plating the resistors, and optionally but preferably, the exposed copper surfaces. At this stage the plating will occur only on the areas selectively activated in step (d) (i.e. the resistor areas, preferably with some overlap onto the circuits where the resistor connects to the circuits and exposed copper surfaces). A variety of plating baths can advantageously be used. The inventors have found electroless nickel-phosphorous, electroless and precious metal plating baths, including palladium-phosphorus, or ruthenium-phosphorus electroless plating baths, to be particularly useful in this regard. In addition, it may be optionally desirable to clean and/or accelerate the surfaces prior to plating.

Obviously, the thickness of the metal plated has a direct impact on the resistivity of the resultant resistor. The inventors have found that typically it is advantageous to plate metal thickness in the range of from 0.05 to 0.2 microns, preferably 0.10 microns. Plating advantageously takes 5 to 10 minutes, more preferably 2 to 3 minutes depending upon the plating bath used and the ultimate resistance desired.

Depending upon the ultimate resistance desired, the following factors may be adjusted to vary the resistivity of the resultant resistor: type of metal plated, thickness of the metal plated, length of the resistor and, width of the resistor. With regard to type of metal plated, the phosphorous content of the metal-phosphorous will affect the resistivity of the final deposit. All of the foregoing factors may be varied to achieve the ultimate resistance desired. The inventors have found that the intrinsic resistance of the metal plated increases with the phosphorous content of the metal. They have found, for example, that it is most advantageous to plate the resistors with nickel having a phosphorous content of greater than 10% by weight. The inventors have found that high phosphorous containing metals, produce a plated coating with relatively high intrinsic resistance. Therefore, for any given desired ultimate resistance for the resistor, a greater thickness of material (holding length and width constant) can be plated, thereby yielding more reliable plated resistors. This also allows for commercially acceptable plating times Step (g) optionally provides for controlled oxidation of the plated resistor metal preferably by controlled chemical oxidation. The inventors have discovered that controlled oxidation is a method for increasing the resistivity of the plated resistor and more importantly of providing for more predictable resistance on a consistent basis. In this regard, a variety of oxidants may be used including potassium iodate, which is preferred. If potassium iodate is used, an aqueous solution with from 10–75 gr/l potassium iodate at a temperature of 90° C. and for a time of 5 minutes has proven effective. Here again, the higher intrinsic resistance material allows for greater thickness of plated material (other variables constant), more reliable plated resistors and commercially acceptable plating times.

Finally, step (h) provides for coating the resistors with a permanent protective coating. It is usually desirable to coat the surfaces of the board, including the plated resistors, with a dielectric material such as a solder mask or an epoxy or other resin system. Other systems would also be readily apparent to those skilled in the art. This protective coating serves to protect the board from damage in subsequent processing steps and enhances the durability of the resulting product. Typical solder mask processing is described, for example, in U.S. Pat. No. 5,296,3344, the teachings of which are incorporated herein by reference in their entirety.

The following examples are presented for illustrative purposes only and should not be taken as limiting in any way.

EXAMPLE I

Copper coated laminates were processed through the following sequence:

1) A liquid or dry film was laminated to both copper surfaces of the laminate.
2) The resist was exposed and developed so that the required circuits are protected and the resistor area opened.
3) The resist area and the required circuitry were printed and etched.
4) The photoresist was stripped from the surface, and the surface of the board was coated with another liquid or dry film photoresist.
5) The resist was exposed and developed so that the resistor area and some of the adjacent copper circuit were opened.
6) The panel was processed through an activation cycle normally used in the activation of a through hole circuit board. A mask was applied to the panel prior to activation so that the surface was only selectively activated.

7) The photoresist was stripped from the surface, and an accelerator was used to prepare the metal and resin activated resistor area. The resistors and-circuitry were then electrolessly plated with a resistive metal to a thickness to yield the designed resistor value.

EXAMPLE II

Copper coated laminates were processed through the following sequence:

1) A liquid or dry film was laminated to both copper surfaces of the laminate.
2) The resist was exposed and developed so that the required circuits are protected and the resistor area opened.
3) The resist area and the required circuitry were printed and etched.
4) The photoresist was stripped from the surface.
5) The surface of the board was conditioned.
6) The surface of the board was coated with another liquid or dry film photoresist.
7) The resist was exposed and developed so that the resistor area and some of the adjacent copper circuit were opened.
8) The panel was activated.
9) The photoresist was stripped from the surface, and an accelerator was used to prepare the metal and resin activated resistor area. The resistors and circuitry were then electrolessly plated with a resistive metal to a thickness to yield the designed resistor value.

What is claimed is:

1. A method for manufacturing a printed circuit board with integral plated resistors, comprising the steps of:
   (a) printing and etching an electronic circuit in a desired pattern on a surface of a metal clad laminate, which laminate comprises a polymer-based core with metal cladding thereupon, and leaving openings in said desired pattern of said electronic circuit onto which a resistive material can be plated;
   (b) coating said printed and etched electronic circuit with a resist and exposing said electronic circuit so that the openings in the desired pattern and a portion of the metal cladding are exposed;
   (c) conditioning and selectively activating the exposed areas of the metal clad laminate to accept plating thereon;
   (d) stripping the resist; and
   (e) plating the activated area and the remainder of the metal circuits with said resistive material to create an integral plated resistor.

2. The method according to claim 1 wherein the metal cladding comprises copper.

3. The method according to claim 1, wherein steps (a) through (e) are repeated to produce multiple integral plated resistors on the surface of the metal clad laminate.

4. The method according to claim 1, further comprising a step of coating said integral plated resistor with a permanent dielectric coating to protect the plated resistor from additional processing steps.

5. The method according to claim 4 wherein said permanent dielectric coating is selected from the group consisting of epoxy or other resin systems and soldermasks.

6. The method according to claim 1, wherein said step (c) is accomplished using a mask so as to activate only selected portions of the exposed areas of the metal clad laminate.

7. The method according to claim 1 wherein the resist comprises a negative or positive acting dry film or liquid photo-resist.

8. The method according to claim 1 wherein the resistive material comprises a material selected from the group consisting of electroless nickel-phosphorous, palladium-phosphorus, and electroless ruthenium-phosphorus.

9. The method according to claim 1 wherein the resistive material is plated to a thickness from about 0.5 to about 0.2 microns.

10. The method according to claim 9 wherein the resistive material is plated to a thickness of about 0.1 microns.

11. The method according to claim 1 wherein prior to step (c), the surface is made uniform.

12. The method according to claim 11 wherein the surface is made uniform by a process selected from the group consisting of chemical etching, plasma etching, laser normalization, vapor blasting, sanding shot blasting, and sand blasting.

13. The method according to claim 1, wherein the integral plated resistors formed in step (e) are exposed to an oxidant subsequent to step (e).

14. A method for manufacturing a printed circuit board with integral plated resistors, comprising the steps of:
   (a) printing and etching an electronic circuit in a desired pattern on a surface of a metal clad laminate, which laminate comprises a polymer-based core with metal cladding thereupon, and leaving openings in said desired pattern of said electronic circuit onto which a resistive material can be plated;
   (b) conditioning said printed and etched electronic circuit;
   (c) coating said printed and etched electronic circuit with a resist and exposing said electronic circuit so that the openings in the desired pattern and a portion of the metal cladding are exposed;
   (d) selectively activating the exposed areas of the metal clad laminate to accept plating thereon;
   (e) stripping the resist; and
   (f) plating the activated area and the remainder of the metal circuits with said resistive material to create an integral plated resistor.

15. The method according to claim 14 wherein the metal cladding comprises copper.

16. The method according to claim 14, wherein steps (a) through (f) are repeated to produce multiple integral plated resistors on the surface of the metal clad laminate.

17. The method according to claim 14, further comprising a step of coating said integral plated resistor with a permanent dielectric coating to protect the plated resistor from additional processing steps.

18. The method according to claim 17 wherein said permanent dielectric coating is selected from the group consisting of epoxy or other resin systems and soldermasks.

19. The method according to claim 14, wherein said step (d) is accomplished using a mask so as to activate only selected portions of the exposed areas of the metal clad laminate.

20. The method according to claim 14 wherein the resist comprises a negative or positive acting dry film or liquid photo-resist.

21. The method according to claim 14 wherein the resistive material comprises a material selected from the group consisting of electroless nickel-phosphorous, palladium-phosphorus, and electroless ruthenium-phosphorus.

22. The method according to claim 14 wherein the resistive material is plated to a thickness from about 0.5 to about 0.2 microns.

23. The method according to claim 22 wherein the resistive material is plated to a thickness of about 0.1 microns.

24. The method according to claim 14 wherein prior to step (d), the surface is made uniform.

25. The method according to claim 24 wherein the surface is made uniform by a process selected from the group consisting of chemical etching, plasma etching, laser normalization, vapor blasting, sanding shot blasting, and sand blasting.

26. The method according to claim 14, wherein the integral plated resistors formed in step (f) are exposed to an oxidant subsequent to step (f).

* * * * *